United States Patent
Zhang et al.

(10) Patent No.: US 11,289,484 B2
(45) Date of Patent: Mar. 29, 2022

(54) FORMING SOURCE AND DRAIN REGIONS FOR SHEET TRANSISTORS

(71) Applicant: INTERNATIONAL BUSINESS MACHINES CORPORATION, Armonk, NY (US)

(72) Inventors: Jingyun Zhang, Albany, NY (US); Ruilong Xie, Niskayuna, NY (US); Xin Miao, Slingerlands, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 15 days.

(21) Appl. No.: 16/733,852

(22) Filed: Jan. 3, 2020

(65) Prior Publication Data
US 2021/0210489 A1 Jul. 8, 2021

(51) Int. Cl.
| | |
|---|---|
| *H01L 29/06* | (2006.01) |
| *H01L 27/092* | (2006.01) |
| *H01L 21/84* | (2006.01) |
| *H01L 29/786* | (2006.01) |
| *H01L 29/423* | (2006.01) |
| *H01L 29/45* | (2006.01) |
| *H01L 21/8234* | (2006.01) |
| *H01L 21/8238* | (2006.01) |

(52) U.S. Cl.
CPC .. *H01L 27/0924* (2013.01); *H01L 21/823814* (2013.01); *H01L 29/78696* (2013.01)

(58) Field of Classification Search
CPC ......... H01L 21/28088; H01L 29/41783; H01L 21/823842; H01L 29/4966
See application file for complete search history.

(56) References Cited

U.S. PATENT DOCUMENTS

| | | |
|---|---|---|
| 9,281,382 B2 | 3/2016 | Liu et al. |
| 9,735,154 B2 | 8/2017 | Wei et al. |
| (Continued) | | |

FOREIGN PATENT DOCUMENTS

| | | |
|---|---|---|
| CN | 103276486 B | 9/2013 |
| CN | 107257711 A | 10/2017 |

OTHER PUBLICATIONS

J .Ryckaert et al., "Extending the roadmap beyond 3nm through system scaling boosters: A case study on Buried Power Rail and Backside Power Delivery," Electron Devices Technology and Manufacturing Conference (EDTM), 2019, pp. 50-52.

(Continued)

*Primary Examiner* — Brian Turner
(74) *Attorney, Agent, or Firm* — Cantor Colburn LLP; Jeffrey S LaBaw

(57) ABSTRACT

A semiconductor device is provided. The semiconductor device includes an n-doped field effect transistor (nFET) section, a p-doped field effect transistor (pFET) section and an insulator pillar. The nFET section includes nFET nanosheets and nFET source or drain (S/D) regions partially surrounding the nFET nanosheets. The pFET section includes pFET nanosheets and pFET S/D regions partially surrounding the pFET nanosheets. The insulator pillar is interposed between the nFET S/D regions and the pFET S/D regions to form a fork-sheet structure with the nFET nanosheets and the pFET nanosheets.

13 Claims, 10 Drawing Sheets

(56) References Cited

U.S. PATENT DOCUMENTS

| | | | |
|---|---|---|---|
| 9,947,743 B2 | 4/2018 | Doris et al. | |
| 9,984,936 B1 | 5/2018 | Xie et al. | |
| 9,997,618 B2 | 6/2018 | Cheng et al. | |
| 10,068,970 B2 | 9/2018 | Cheng et al. | |
| 10,236,292 B1 | 3/2019 | Frougier et al. | |
| 10,665,669 B1* | 5/2020 | Xie | H01L 29/42392 |
| 2012/0098083 A1* | 4/2012 | Meyer | H01L 21/76224 |
| | | | 257/500 |
| 2014/0312428 A1* | 10/2014 | Adam | H01L 29/66628 |
| | | | 257/369 |
| 2017/0077231 A1* | 3/2017 | Balakrishnan | H01L 29/7842 |
| 2018/0122703 A1* | 5/2018 | Cheng | H01L 21/823431 |
| 2021/0005722 A1* | 1/2021 | Glass | H01L 29/0653 |

OTHER PUBLICATIONS

P. Weckx et al., "Stacked nanosheet fork architecture for SRAM design and device co-optimization toward 3nm," International Electron Devices Meeting (IEDM), 2017, 20.5, 4 pp.

Peter Clarke, "Here comes the forksheet transistor," eeNews, May 20, 2019, downloaded from the Internet Aug. 15, 2019, https://www.eenewsanalog.com/news/here-comes-forksheet-transistor-says-imec, 2 pages.

* cited by examiner

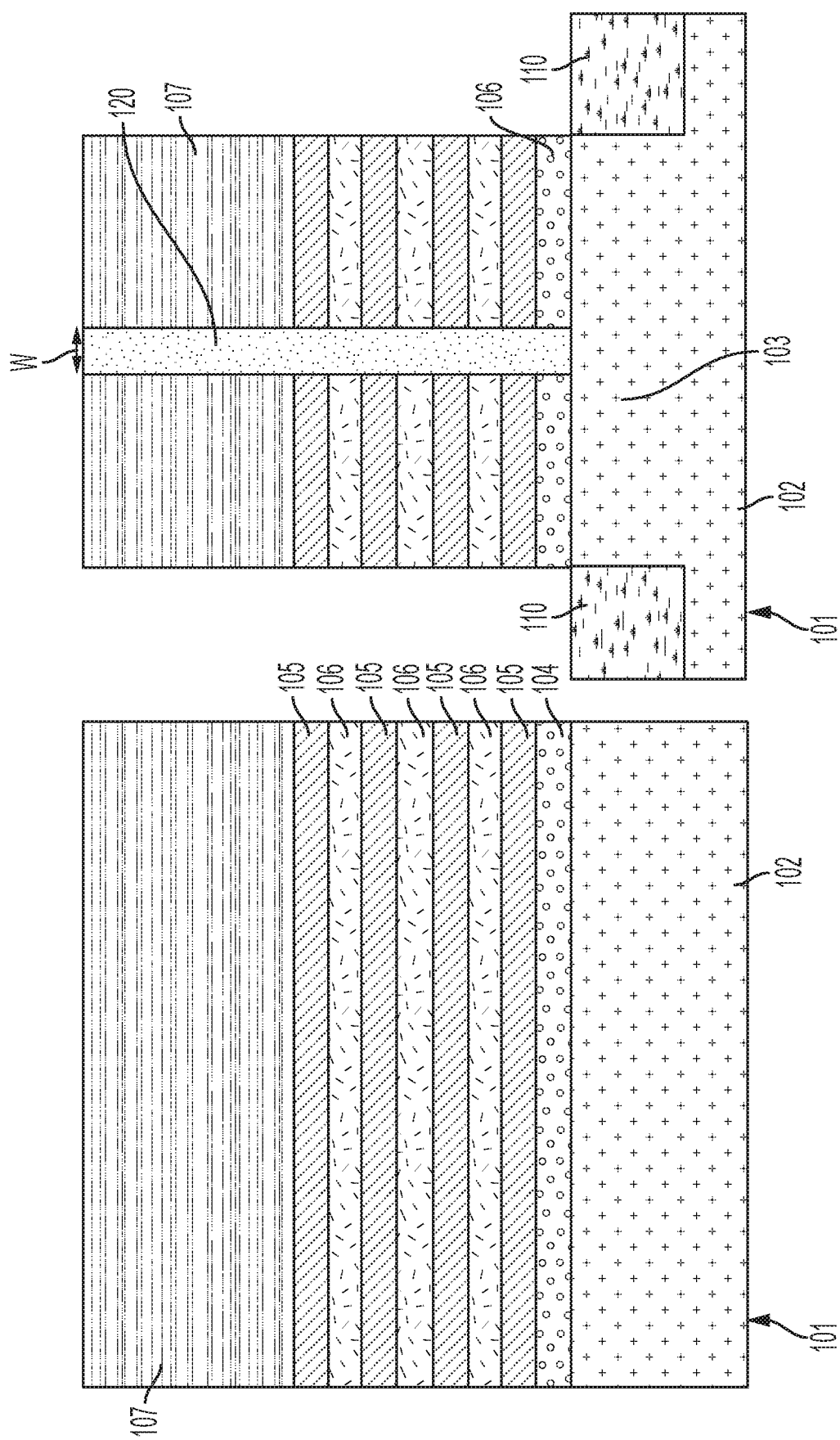

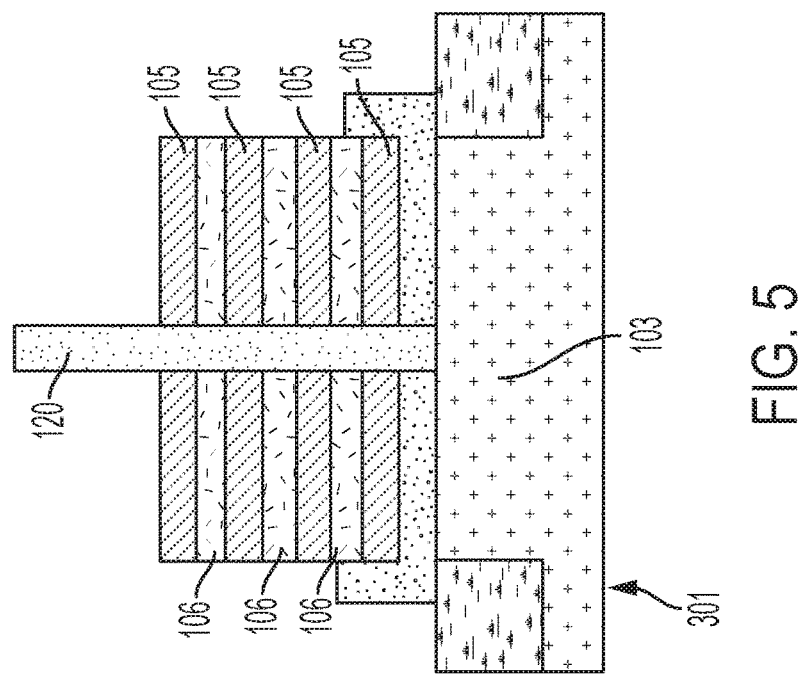
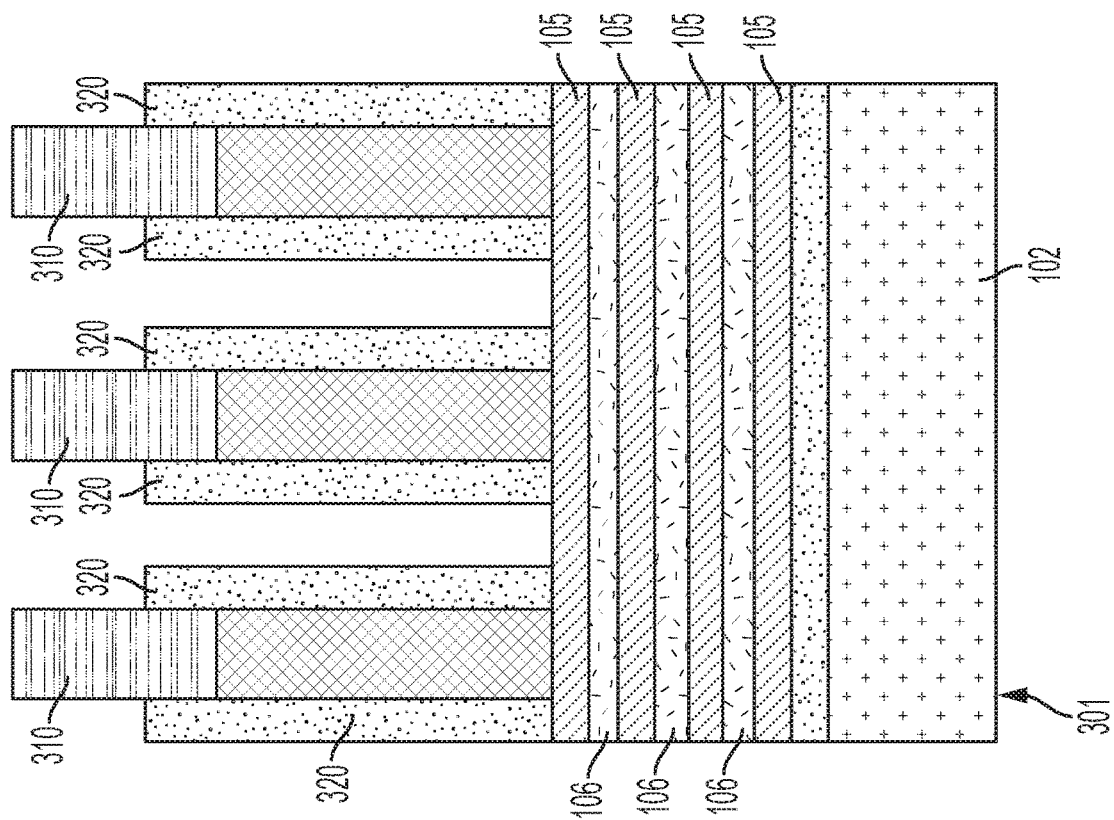

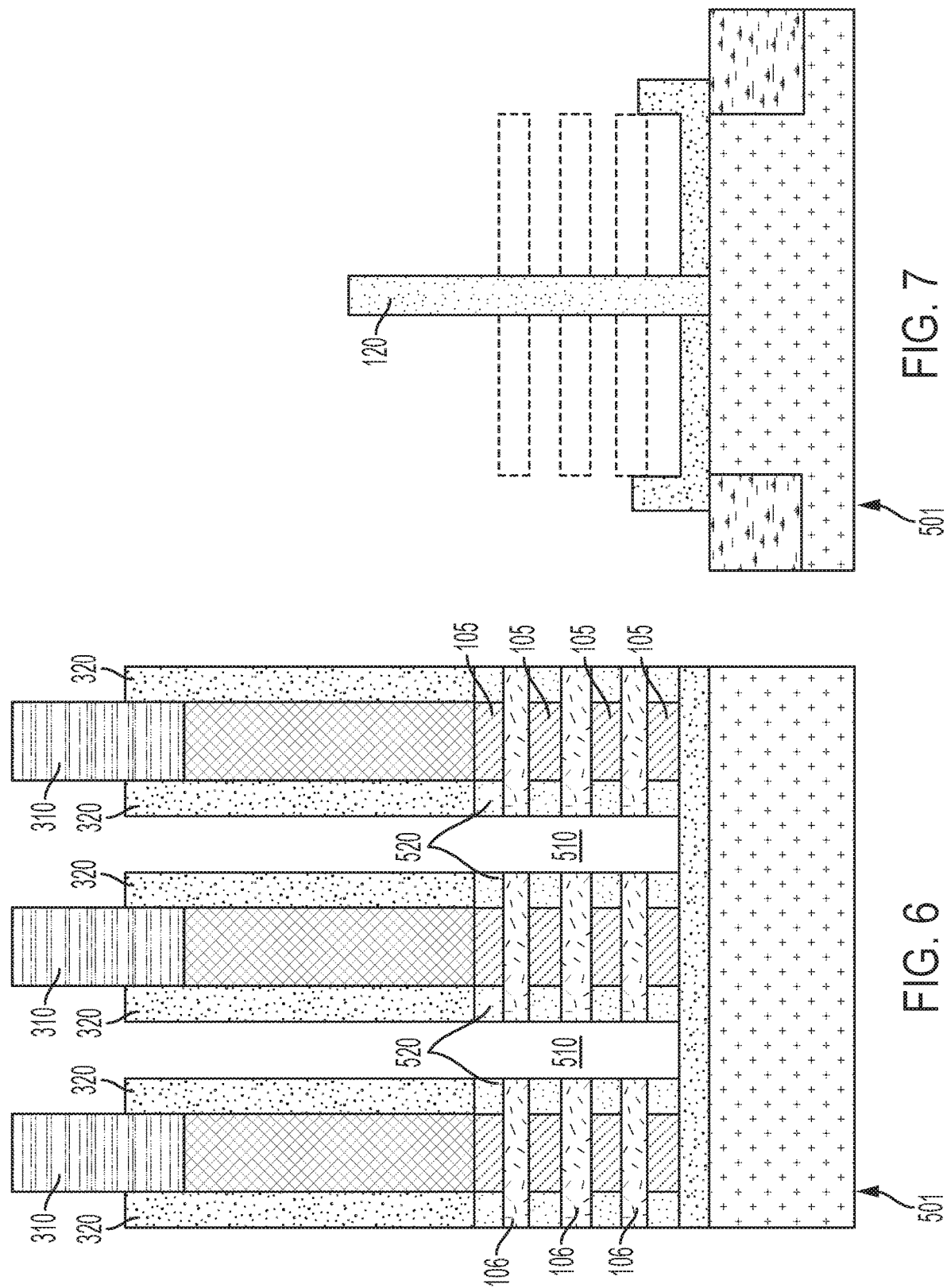

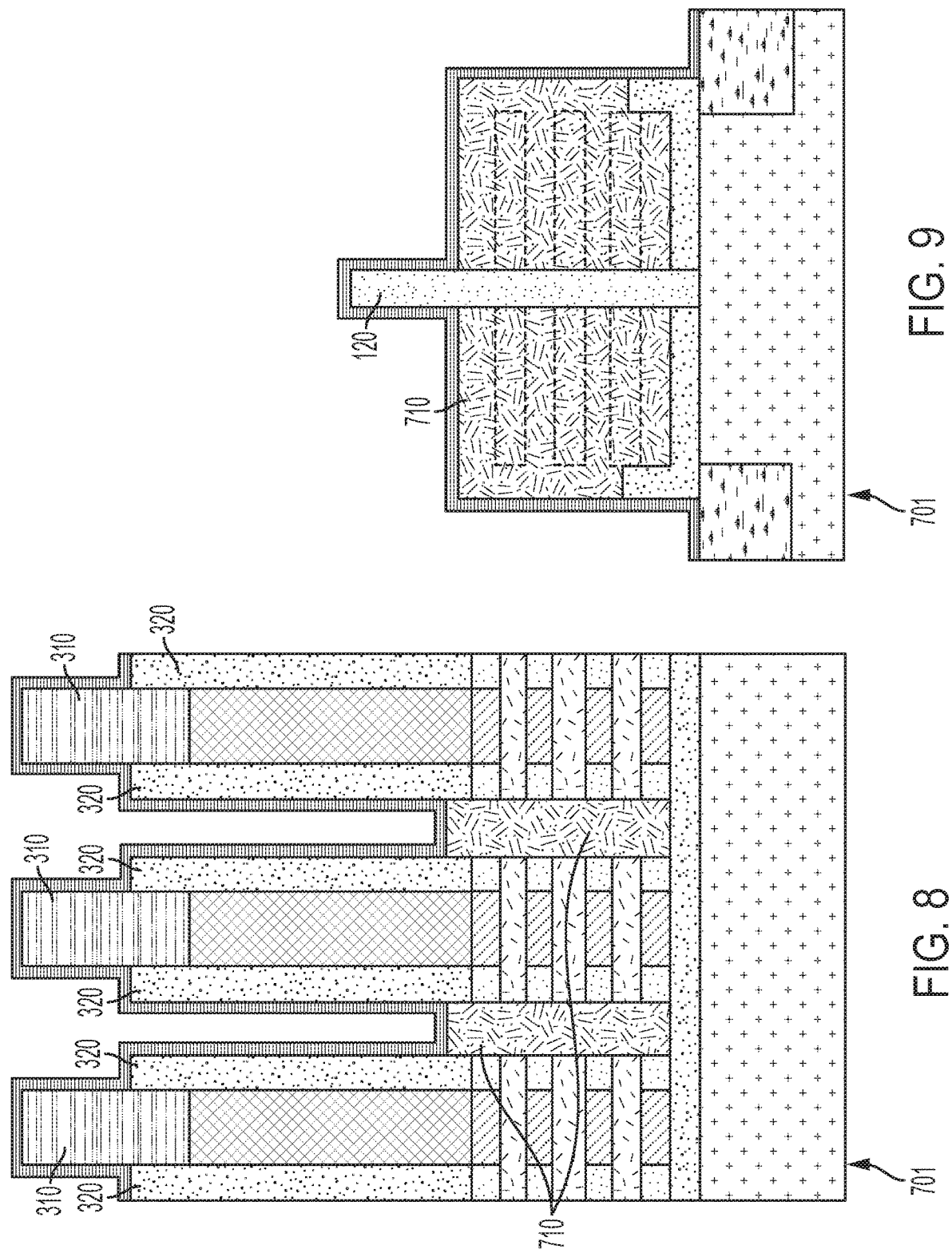

FORMING SOURCE AND DRAIN REGIONS FOR SHEET TRANSISTORS

BACKGROUND

The present invention generally relates to fabrication methods and resulting structures for semiconductor devices. More specifically, the present invention relates to forming the source and drain regions for a scaled sheet transistor.

As semiconductor devices are increasingly reduced in size, efforts have been undertaken to decrease cell height. Cell height refers to a total height of the following elements: individual heights of n-doped field effect transistor (nFET) fins, the distance between adjacent nFET fins, individual heights of p-doped field effect transistor (pFET) fins, the distance between adjacent pFET fins and the distance between the near-most nFET and pFET fins (i.e., the "N2P space"). Reductions in cell height can be achieved through fin depopulation, in which the number of nFET fins and pFET fins is reduced, and through reductions in the distance between the nFET fins and the pFET fins (fin depopulation+N2P space scaling).

SUMMARY

Embodiments of the present invention are directed to a semiconductor device. A non-limiting example of the semiconductor device includes an n-doped field effect transistor (nFET) section, a p-doped field effect transistor (pFET) section and an insulator pillar. The nFET section includes nFET nanosheets and nFET source or drain (S/D) regions partially surrounding the nFET nanosheets. The pFET section includes pFET nanosheets and pFET S/D regions partially surrounding the pFET nanosheets. The insulator pillar is interposed between the nFET S/D regions and the pFET S/D regions to form a fork-sheet structure with the nFET nanosheets and the pFET nanosheets.

Embodiments of the present invention are directed to a semiconductor device. A non-limiting example of the semiconductor device includes an n-doped field effect transistor (nFET) section, a p-doped field effect transistor (pFET) section and an insulator pillar. The nFET section includes nFET nanosheets and nFET source or drain (S/D) regions partially surrounding the nFET nanosheet. The pFET section includes pFET nanosheets and pFET S/D regions partially surrounding the pFET nanosheets. The insulator pillar is interposed between the nFET S/D regions and the pFET S/D regions with a width of about 10 nm or less and includes an uppermost surface taller than respective uppermost surfaces of the nFET S/D regions and the pFET S/D regions with respect to a substrate and sidewalls disposed in contact with respective short edges of the nFET nanosheets and the pFET nanosheets to form a fork-sheet structure.

Embodiments of the invention are directed to a method of fabricating a semiconductor device. A non-limiting example of the method includes forming an insulator pillar between n-doped and p-doped field effect transistor (nFET and pFET) sections, growing sacrificial undoped source or drain (S/D) regions in the nFET and pFET sections, masking the sacrificial undoped S/D regions in one of the nFET and pFET sections, etching the sacrificial undoped S/D regions in the other of the nFET and pFET sections and sequentially growing doped S/D regions in the other of the nFET and pFET sections and the one of the nFET and pFET sections.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 is a cross-sectional view of the semiconductor device of FIG. 1 taken along line X and depicts a structure resulting from nanosheet patterning in accordance with embodiments of the present invention;

FIG. 3 is a cross-sectional view of the structure of FIG. 2 taken along line Y of FIG. 1 and depicts the formation of shallow trench isolation (STI) elements and an insulator pillar to provide N2P separation in accordance with embodiments of the present invention;

FIG. 4 depicts a structure following hard mask removal, dummy gate formation, a silicon germanium 60 (SiGe60) layer removal and spacer formation in accordance with embodiments of the present invention;

FIG. 5 is a cross-sectional view of the structure of FIG. 4 between the dummy gates and spacers and depicts the SiGe60 layer removal and the spacer formation in accordance with embodiments of the present invention;

FIG. 6 depicts a structure following nanosheet recession and inner spacer formation in accordance with embodiments of the present invention;

FIG. 7 is a cross-sectional view of the structure of FIG. 6 between the dummy gates and spacers and depicts the nanosheet recession in accordance with embodiments of the present invention;

FIG. 8 depicts a structure following sacrificial undoped epitaxially grown source or drain (S/D) regions and liner deposition in accordance with embodiments of the present invention;

FIG. 9 is a cross-sectional view of the structure of FIG. 8 between the dummy gates and spacers and depicts the sacrificial undoped S/D regions growth and liner deposition in accordance with embodiments of the present invention;

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, to the extent that reductions in cell height in a semiconductor device are achieved through fin depopulation, the resulting structure can be a semiconductor device cell with a single nFET nanosheet as opposed to two, three or four nFET fins, as well as a single pFET nanosheet as opposed to two, three or four pFET fins. Each of the nanosheets is substantially taller than an nFET or pFET fin and the space between the nanosheets is referred to as the "N2P space." Hereinafter, references to cell height and the distance across the N2P space relate to distances along the axis Y in the plane of the page of FIG. 1 (to be discussed below).

Figure 1:
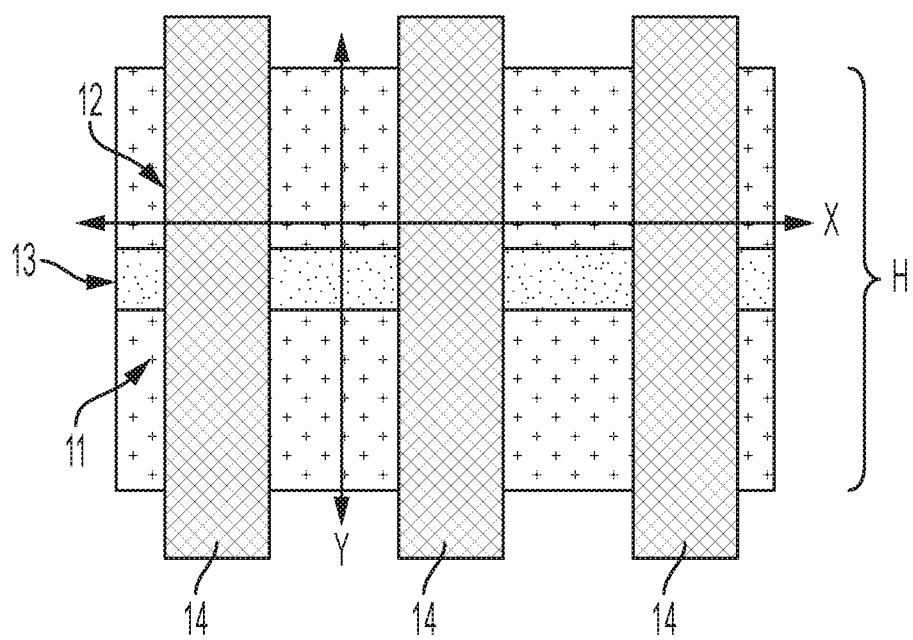
FIG. 1 is a top-down view of a semiconductor device structure in accordance with embodiments of the present invention.

Currently, while cell heights have been reduced by the use of nFET and pFET nanosheets as opposed to fin structures, the state of the art of the N2P space remains around 50 nm (again, along the axis Y in the plane of the page of FIG. 1). This places a limit on the total cell height reduction that is possible even with nFET and pFET nanosheets.

Thus, as semiconductor devices are increasingly reduced in size, it has become desirable to provide N2P space on the order of less than about 15 nm and, particularly, on the order of about ~8 to ~10 nm in a semiconductor device with nFET and pFET nanosheets (again, along the axis Y in the plane of the page of FIG. 1). It is, however, challenging to form CMOS epitaxy in such tightly scaled N2P spaces and this has led to a lack of semiconductor devices that make use of nanosheets with tightly scaled N2P spaces.

Turning now to an overview of the aspects of the invention, one or more embodiments of the invention address the above-described shortcomings of the prior art by providing a circuit or semiconductor device that includes nFET and pFET nanosheets and an insulator pillar between nFET and pFET source and/or drain (S/D) regions where the insulator pillar forms a fork-sheet structure, a width of the insulator pillar is about ~10 nm or less, a top surface of the insulator pillar is taller than a top surface of the S/D region and a shorter edge of the nanosheets abuts the insulator pillar. This can be achieved by forming a close N-P boundary using a sacrificial insulator pillar, forming an extremely close N-P boundary without an epitaxial breach using a dielectric liner and forming a close N-P boundary with one side of a nanosheet anchored by the insulator pillar so as to prevent a work function metal (WFM) etch out issue.

The above-described aspects of the invention address the shortcomings of the prior art by providing a circuit or semiconductor device with nFET and pFET nanosheets with N2P spacing on the order of about ~10-15 nm or less or, more particularly, with N2P spacing on the order of about ~8 nm.

Turning now to a more detailed description of aspects of the present invention, FIG. 1 is a top-down view of a semiconductor device 10 including an nFET section 11, a pFET section 12 and an insulator pillar 13. The nFET section 11 includes nanosheets and nFET source or drain (S/D) regions partially surrounding the nFET nanosheets and the pFET section 12 includes pFET nanosheets and pFET S/D regions partially surrounding the pFET nanosheets. The insulator pillar 13 is interposed between the nFET S/D regions and the pFET S/D regions and has a width of about 10 nm or less or, more particularly, a width of about 8 nm such that a height H of the semiconductor device 10 is minimized. The semiconductor device 10 further includes one or more gate structures 14 traversing the nFET section 11, the insulator pillar 13 and the pFET section 12.

FIG. 2 is a cross-sectional view taken along line X of FIG. 1 and depicts a structure 101 resulting from nanosheet patterning in accordance with embodiments of the present invention and FIG. 3 is a cross-sectional view taken along line Y of FIG. 1 of the structure 101 of FIG. 2 and depicts the formation of shallow trench isolation (STI) elements 110 and an insulator pillar 120 to provide N2P separation in accordance with embodiments of the present invention. The structure 101 includes a substrate 102 that is formed into a substrate pillar 103 (see FIG. 3), which is surrounded by the STI elements 110, and from which the insulator pillar 120 extends vertically upwardly. The structure 101 further includes a silicon germanium 60 (SiGe60 where 40% of the material is silicon and 60% of the material is germanium) layer 104 on the substrate 102, silicon germanium 30 (SiGe30 where 70% of the material is silicon and 30% of the material is germanium) layers 105 interleaved with silicon (Si) layers 106 and a hard mask layer 107 formed of silicon nitride (SiN) or another suitable hardmask material on an uppermost one of the SiGe30 layers 105. The insulator pillar 120 can be formed of silicon carbide (SiC) or another suitable material and can be formed by various processes and extends vertically upwardly from the substrate pillar 103 through the SiGe60 layer 104, the SiGe30 layers 105 interleaved with the Si layers 106 and the hard mask layer 107.

In accordance with embodiments of the present invention, a width W of the insulator pillar 120 can be about 10 nm or less. In accordance with further embodiments of the present invention, the width W of the insulator pillar 120 can be about 8 nm.

FIG. 4 depicts a structure 301 following hard mask layer 107 removal, dummy gate formation to form dummy gates 310, SiGe60 layer 104 removal and spacer formation to form spacers 320 on respective sides of the dummy gates 310 executed with respect to the structure 101 of FIGS. 2 and 3 in accordance with embodiments of the present invention. FIG. 5 is a cross-sectional view of the structure 301 of FIG. 4 between the dummy gates 310 and the spacers 320. The dummy gate formation follows the hard mask layer 107 removal and results in the dummy gates 310 being formed at a predefined distance apart on the uppermost one of the SiGe30 layers 105. Each dummy gate 310 includes a lower section and an upper hard mask section. The spacers 320 extend along the sidewalls of the dummy gates 310 and can terminate at a midpoint of the upper hard mask section. A material of the spacers 320 also fills in the space previously occupied by the SiGe60 layer 104 and, as shown in FIG. 5, can extend upwardly along exterior surfaces of lower ones of the SiGe30 layers 105 interleaved with the Si layers 106.

FIG. 6 depicts a structure 501 following nanosheet recession and inner spacer formation executed with respect to the structure 301 of FIGS. 4 and 5 in accordance with embodiments of the present invention and FIG. 7 is a cross-sectional view of the structure 501 of FIG. 6 between the dummy gates 310 and the spacers 320. The nanosheet recession results in the SiGe30 layers 105 and the Si layers 106 being recessed such that the structure 501 defines cavities 510 to correspond to the spaces between the dummy gates 310 and the spacers 320 and in the SiGe30 layers 105 and the Si layers 106 being removed entirely from either side of the insulator pillar 120 as shown in FIG. 7. The nanosheet recession causes the SiGE30 layers 105 to be recessed to the respective widths of the dummy gates 310 and the inner spacer formation generates inner spacers 520 in the remaining spaces that overlap with the now exposed Si layers 106.

FIG. 8 depicts a structure 701 following growth of sacrificial undoped S/D regions 710 and deposition of liner material to form a liner 720 executed with respect to the structure 501 of FIGS. 6 and 7 in accordance with embodiments of the present invention and FIG. 9 is a cross-sectional view of the structure 701 of FIG. 8 between the dummy gates 310 and the spacers 320. The growth of the sacrificial undoped S/D regions 710 occurs in the cavities 510 (see FIG. 6) and on either side of the insulator pillar 120 as shown in FIG. 9. The deposition of the liner material to form the liner 720 results in the liner 720 being formed on the exposed surfaces of the dummy gates 310, the spacers 320 and the sacrificial undoped S/D regions 710 as well as the insulator pillar 120.

Figure 11:
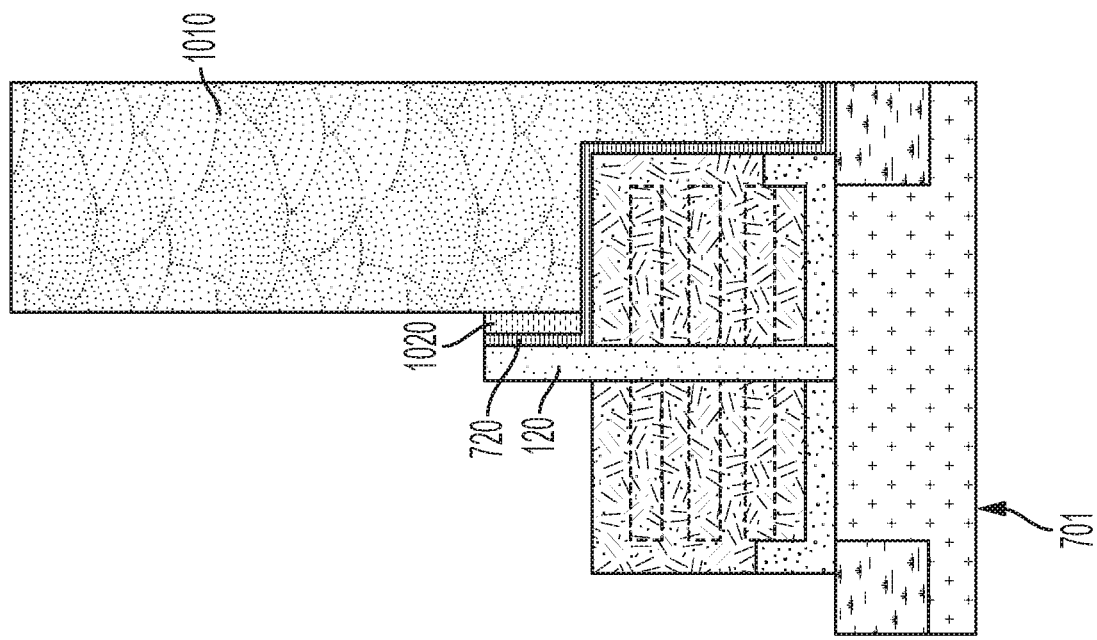
FIG. 11 is a cross-sectional view of the structure of FIG. 8 between the dummy gates and spacers and depicts a rightward worst-case scenario of organic planarization layer (OPL) formation and conformal filling in accordance with embodiments of the present invention.
Figure 10:
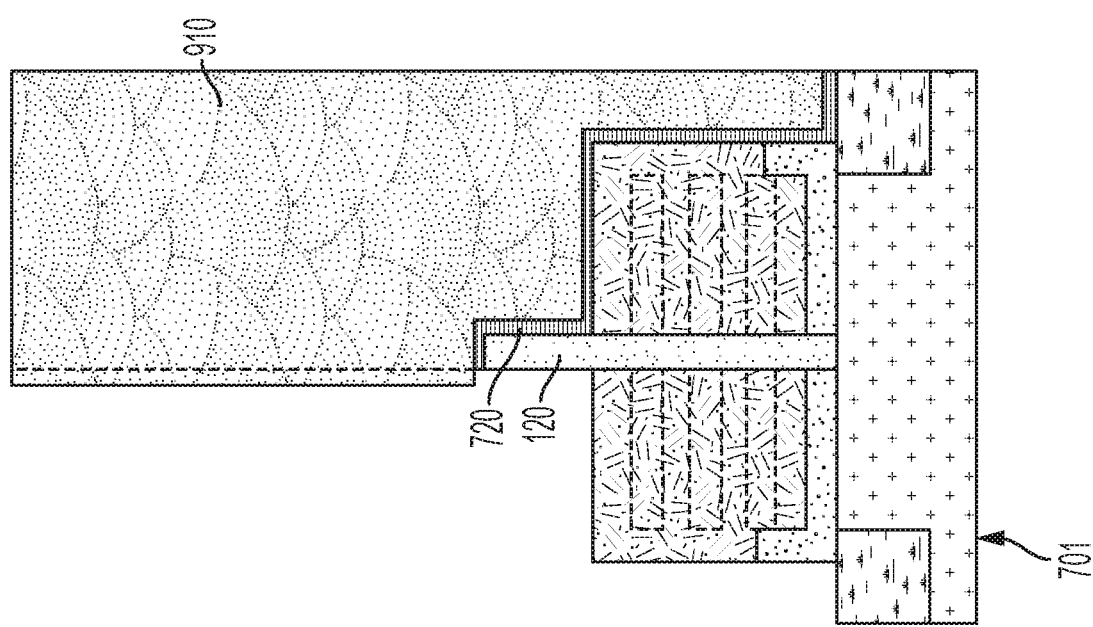
FIG. 10 is a cross-sectional view of the structure of FIG. 8 between the dummy gates and spacers and depicts a leftward worst-case scenario of organic planarization layer (OPL) formation in accordance with embodiments of the present invention.

FIG. 10 is a cross-sectional view of the structure 701 of FIG. 8 between the dummy gates 310 and the spacers 320 and depicts a leftward worst-case scenario of formation of an organic planarization layer (OPL) 910 which can be isotropically etched back to alignment (i.e., along the dashed line of FIG. 10) with the leftward most edge of the insulator pillar 120 in accordance with embodiments of the present invention. FIG. 11 is a cross-sectional view of the structure 701 of FIG. 8 between the dummy gates 310 and the spacers 320 and depicts a rightward worst-case scenario of the formation of the OPL 1010 and conformal filling to form a fillet 1020 between a near-side of the liner 720 along the insulator pillar 120 and the complementary side of the OPL 1010 in accordance with embodiments of the present invention.

The forming of the fillet 1020 can be executed in order to avoid or overcome overlay error.

Figure 13:
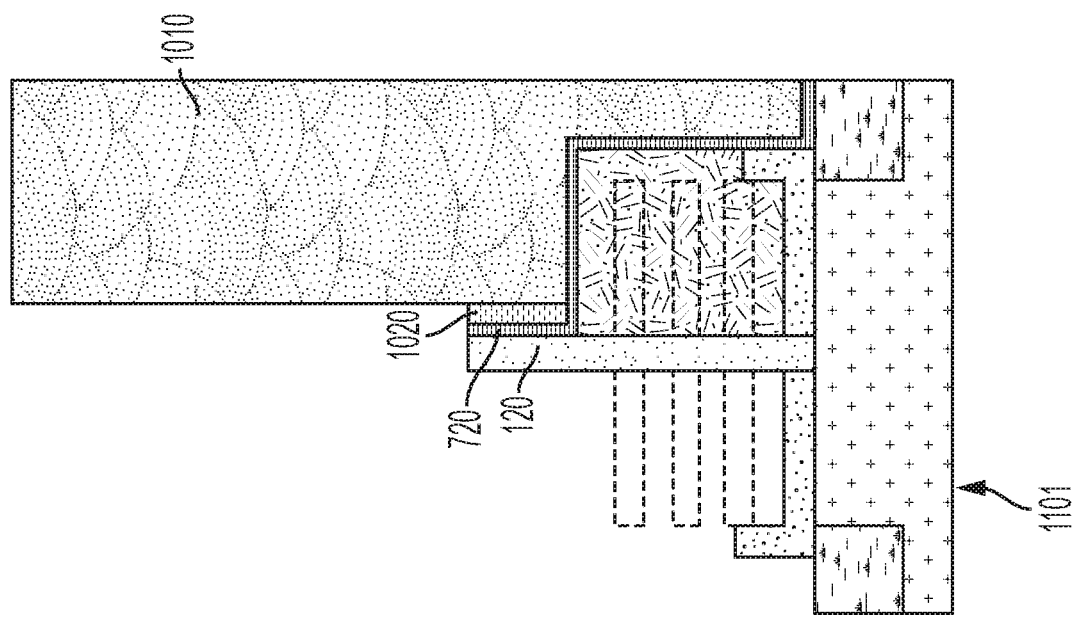
FIG. 13 is a cross-sectional view of the structure of FIG. 12 between the dummy gates and spacers and depicts the sacrificial undoped S/D regions etch in accordance with embodiments of the present invention.
Figure 12:
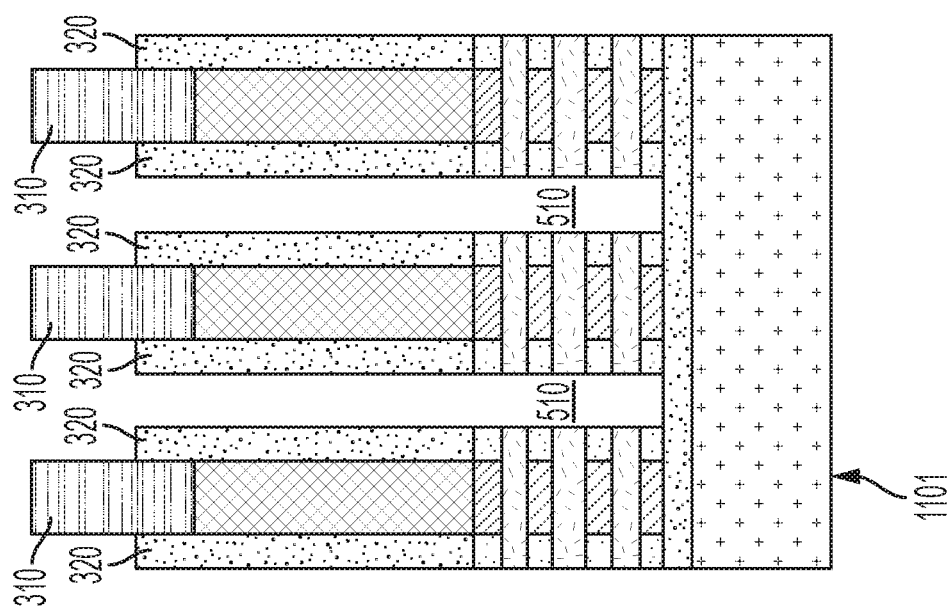
FIG. 12 depicts a structure following sacrificial undoped S/D regions etch in accordance with embodiments of the present invention.

FIG. 12 depicts a structure 1101 following an etching of the sacrificial undoped S/D regions 710 that is not masked by the OPL 910 (see FIG. 10) or by OPL 1010 and fillet 1020 (see FIG. 11) executed with respect to the structure 701 of FIGS. 8-11 in accordance with embodiments of the present invention. FIG. 13 is a cross-sectional view of the structure 1101 of FIG. 12 between the dummy gates 310 and the spacers 320. The etching of the unmasked sacrificial undoped epitaxy 710 results in the redefinition of the cavities 510 (see FIG. 6) as shown in FIG. 12 and the entire removal of the sacrificial undoped epitaxy 710 at the unmasked side of the insulator pillar 120 as shown in FIG. 13 (FIG. 13 illustrates the case of FIG. 11 for purposes of clarity and brevity).

Figure 15:
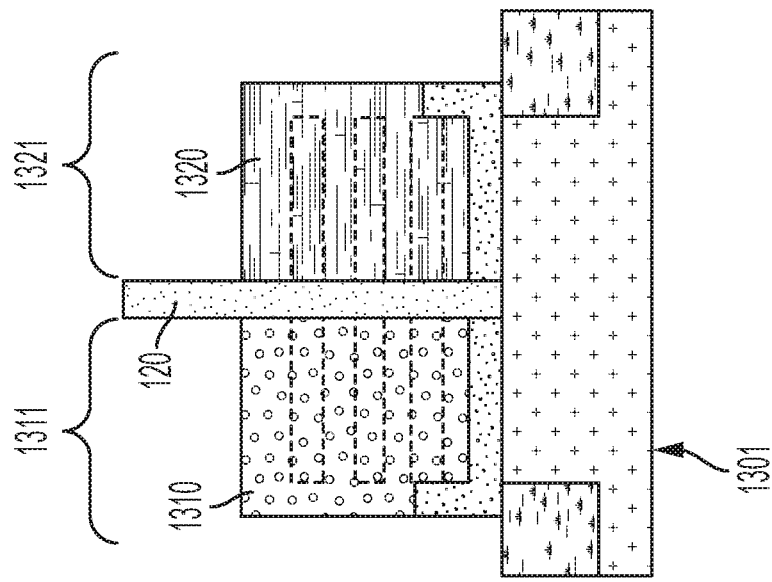
FIG. 15 is a cross-sectional view of the structure of FIG. 14 between the dummy gates and spacers and depicts the doped S/D region formation and liner removal in accordance with embodiments of the present invention.
Figure 14:
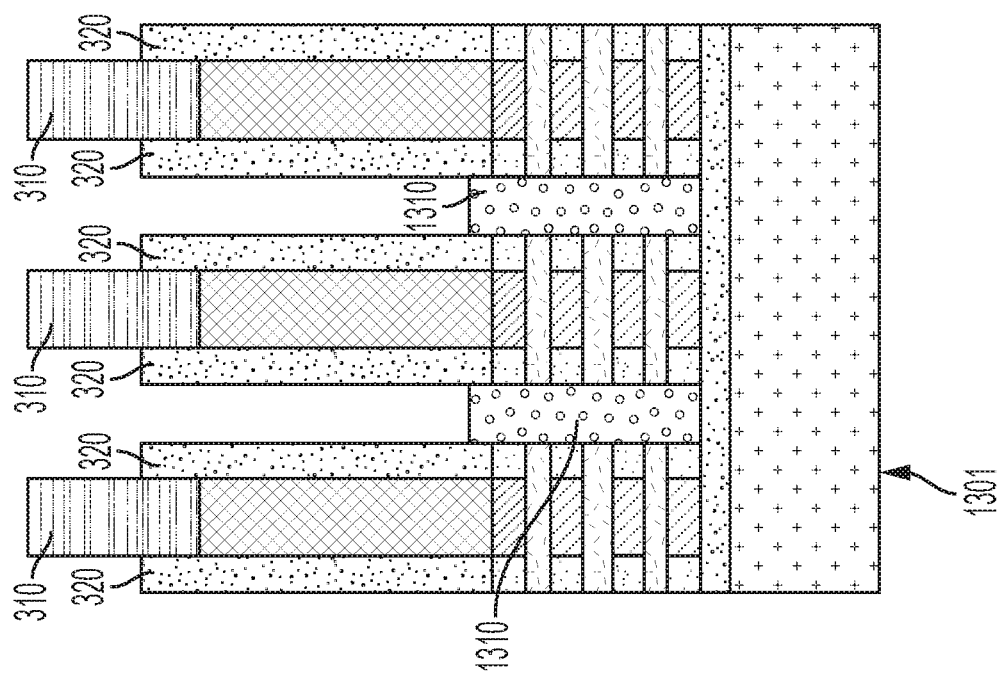
FIG. 14 depicts a structure following doped S/D region formation and liner removal in accordance with embodiments of the present invention.

FIG. 14 depicts a structure 1301 following doped epitaxy formation to form p-doped or pFET epitaxy 1310, liner 720 removal and subsequent doped epitaxy formation to form n-doped or nFET epitaxy 1320 with respect to the structure 1101 of FIGS. 12 and 13 in accordance with embodiments of the present invention. FIG. 15 is a cross-sectional view of the structure 1301 of FIG. 14 between the dummy gates 310 and the spacers 320. The pFET epitaxy 1310 is formed in the cavities 510 (see FIG. 12) and at a first side of the insulator pillar 120 (i.e., a pFET section 1311 as shown in FIG. 15). The nFET epitaxy 1320 is formed at a second side of the insulator pillar 120 (i.e., an nFET section 1321 as shown in FIG. 15) and would be illustrated in the cavities 510 in FIG. 14 if FIG. 14 were viewed along an axis aligned with the nFET section 1321.

The subsequent doped epitaxy formation to form the nFET epitaxy 1320 can be executed similarly as the formation of the pFET epitaxy 1310 as described above.

Figure 17:
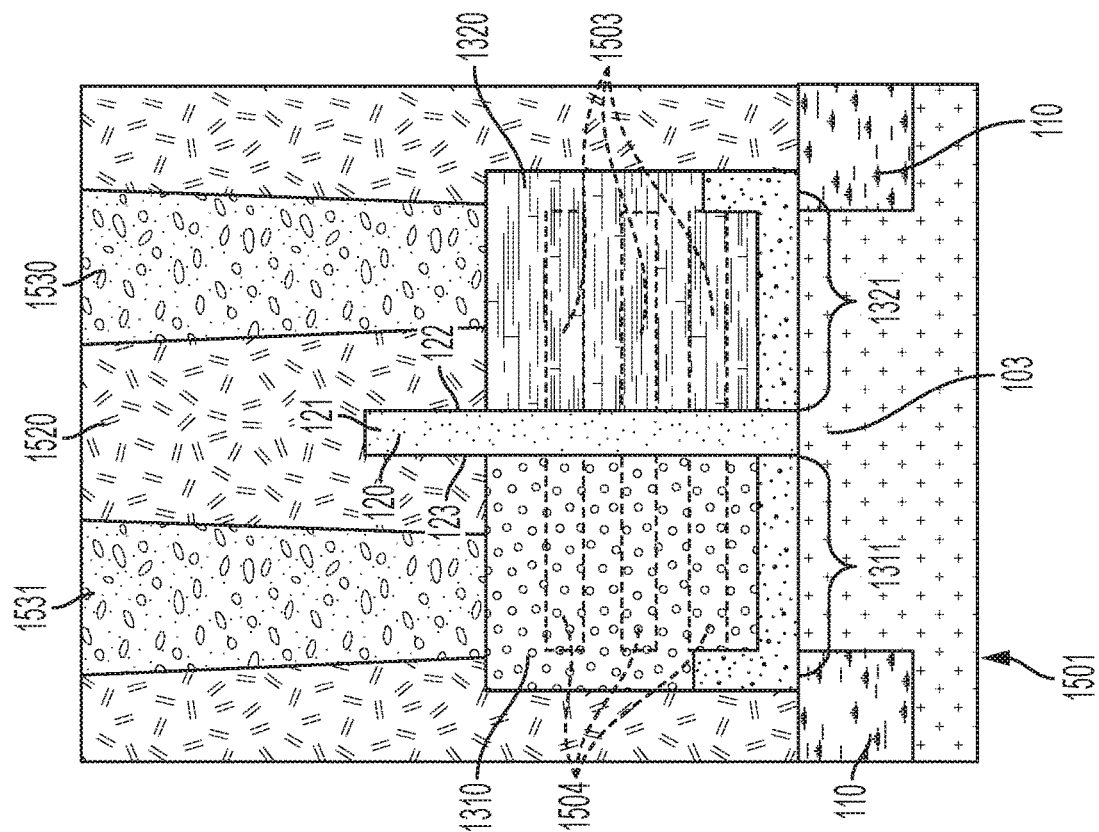
FIG. 17 is a cross-sectional view of the structure of FIG. 16 between the gates and depicts the gate, interlayer dielectric (ILD) and contact formation in accordance with embodiments of the present invention.
Figure 16:
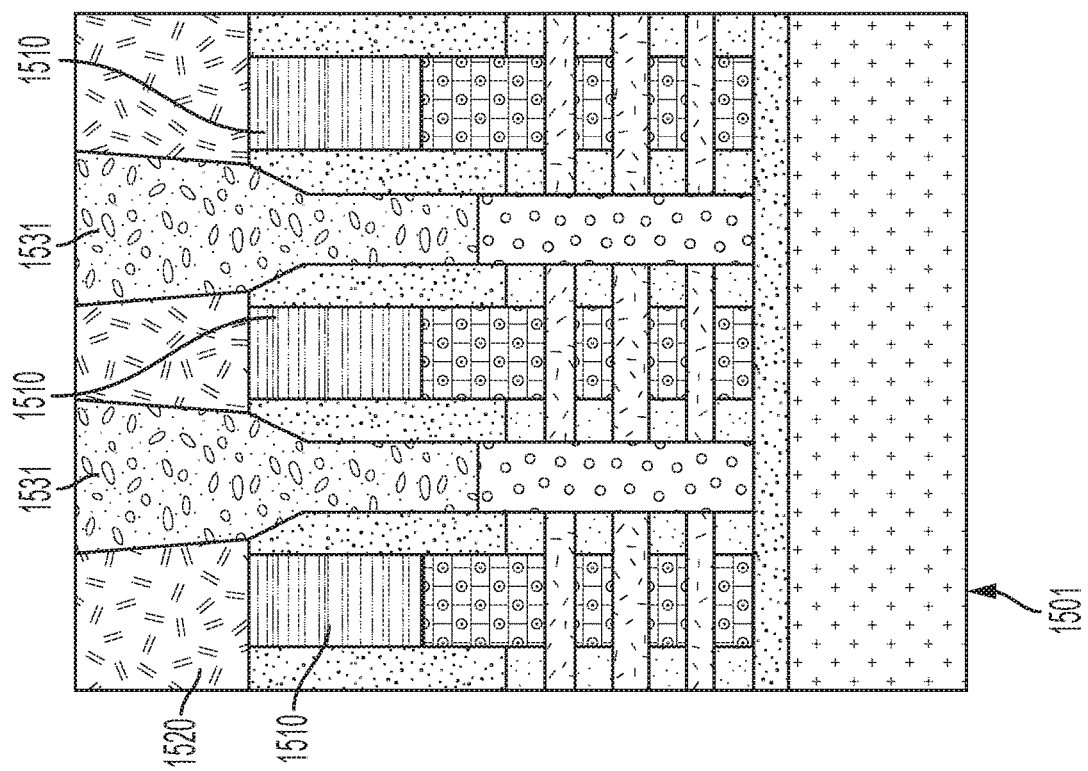
FIG. 16 depicts a structure following gate, interlayer dielectric (ILD) and contact formation in accordance with embodiments of the present invention.

FIG. 16 depicts a final structure 1501 of a semiconductor device following formation of one or more gate structures 1510 in the former locations of the dummy gates 310 and the spacers 320 (see FIG. 14), formation of interlayer dielectric (ILD) 1520 and formation of first and second contacts 1530 and 1531 executed with respect to the structure 1301 of FIGS. 14 and 15 in accordance with embodiments of the present invention. FIG. 17 is a cross-sectional view of the structure 1501 of FIG. 16 between the gate structures 1510.

As shown in FIGS. 16 and 17, the final structure 1501 of the semiconductor device includes nFET section 1321, pFET section 1311 and the insulator pillar 120. The nFET section 1321 includes nFET nanosheets 1503 (i.e., the remainders of the SiGe30 layers 105 in the nFET section 1321) and the nFET epitaxy 1320 partially surrounding the nFET nanosheets 1503. The pFET section 1311 includes pFET nanosheets 1504 (i.e., the remainders of the SiGe30 layer 105 in the pFET section 1311) and pFET epitaxy 1310 partially surrounding the pFET nanosheets 1504. The insulator pillar 120 is interposed between the nFET epitaxy 1320 and the pFET epitaxy 1310 with the width W (see FIG. 3) of about 10 nm or less or about 8 nm. The insulator pillar 120 includes an uppermost surface 121, which is taller than respective uppermost surfaces of the nFET epitaxy 1320 and the pFET epitaxy 1310 with respect to the substrate pillar 103 and the STI elements 110, and sidewalls 122 and 123. The sidewalls 122 and 123 are each disposed in contact with respective short edges of the nFET nanosheets 1503 and the pFET nanosheets 1504. The ILD 1520 is formed around respective portions of the nFET epitaxy 1320, the pFET epitaxy 1310 and the insulator pillar 120. The first and second contacts 1530 and 1531 extend through the ILD 1520 to make contact with the nFET epitaxy 1320 and the pFET epitaxy 1310, respectively. The one or more gate structures 1510 traverse the nFET section 1321, the insulator pillar 120 and the pFET section 1311.

As shown in FIG. 17, the final structure 1501 can have a fork-sheet configuration or other similar configurations. The fork-sheet configuration is generally characterized in that the high-k metal gate elements of the nFET and pFET nanosheets are attached to the sides of the insulator pillar 120 (i.e., as in a general shape of a fork). Other possible configurations include, but are not limited to, T-shaped or t-shaped configurations in which only a single high-k metal gate element is attached to each of the sides of the insulator pillar 120 as well as configurations in which the high-k metal gate elements are transversely oriented relative to the insulator pillar 120 and/or non-linear.

Figure 18:
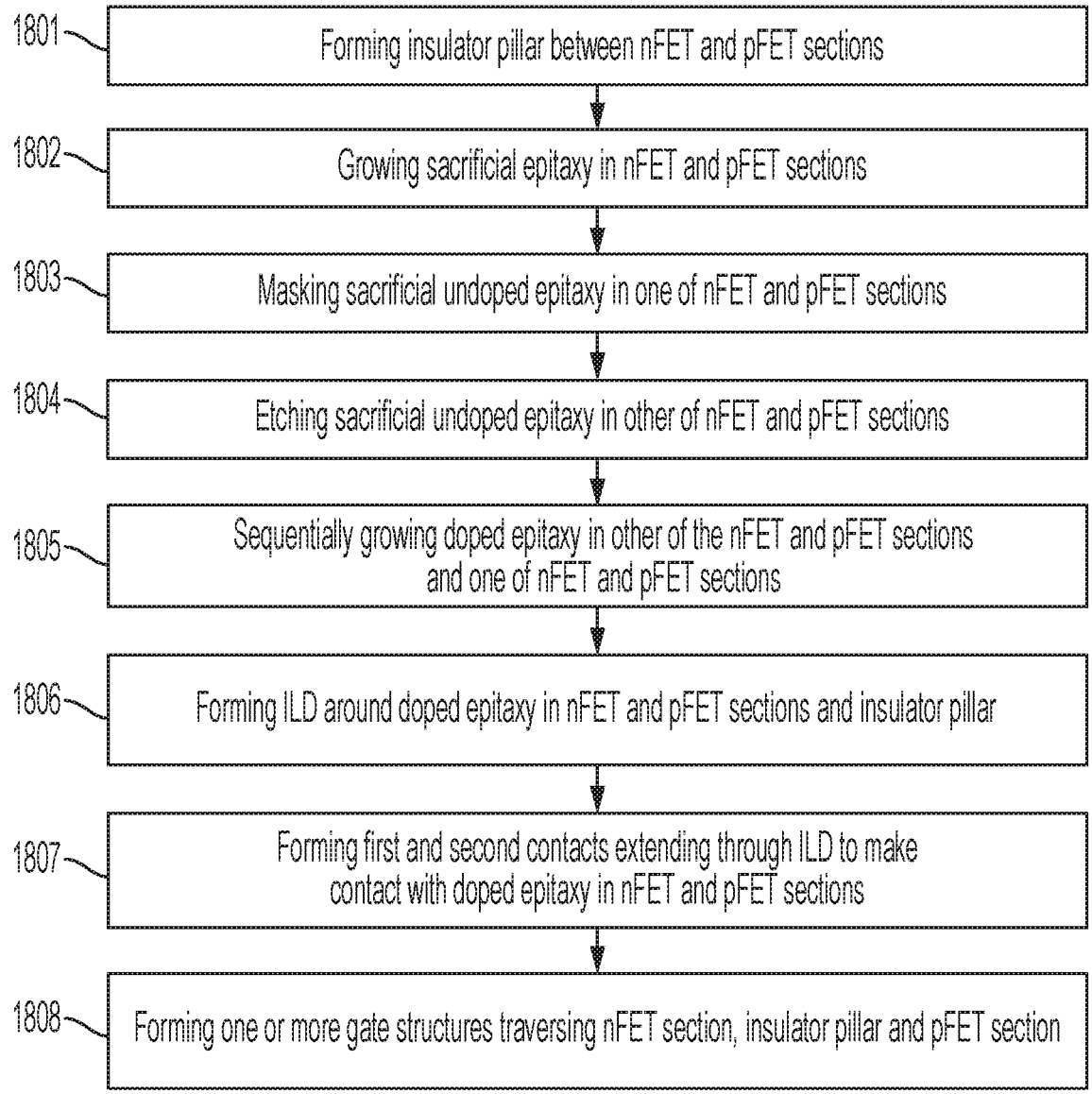
FIG. 18 is a flow diagram illustrating a method of fabricating a semiconductor device in accordance with embodiments of the present invention.

FIG. 18 is a flow diagram illustrating a method of fabricating a semiconductor device in accordance with embodiments of the present invention. As shown in FIG. 18, the method includes forming an insulator pillar between n-doped and p-doped field effect transistor (nFET and pFET) sections (1801), growing sacrificial undoped epitaxy in the nFET and pFET sections (1802), masking the sacrificial undoped epitaxy in one of the nFET and pFET sections (1803), etching the sacrificial undoped epitaxy in the other of the nFET and pFET sections (1804) and sequentially growing doped epitaxy in the other of the nFET and pFET sections and the one of the nFET and pFET sections (1805).

The forming of the insulator pillar of 1801 includes forming the insulator pillar to have a width of about 10 nm or less or to have a width of about 8 nm. In addition, the forming of the insulator pillar of 1801 can include forming the insulator pillar to include an uppermost surface taller than respective uppermost surfaces of the doped epitaxy with respect to a substrate and sidewalls disposed in contact with respective short edges of nFET and pFET nanosheets surrounded by doped epitaxy in the nFET and pFET sections, respectively. The masking of the sacrificial undoped epitaxy in the one of the nFET and pFET sections of 1803 can include forming a liner where the liner prevents doped epitaxy breach during the growing of the doped epitaxy in the other of the nFET and pFET sections of 1805. The insulator pillar and the nFET and pFET sections can be formed on a substrate pillar and STI elements surrounding portions of the substrate pillar and the method can further include forming interlayer dielectric (ILD) around respective portions of the doped epitaxy in the nFET and pFET sections and the insulator pillar (1806), forming first and second contacts extending through the ILD to make contact with the doped epitaxy in the nFET and pFET sections (1807) and forming one or more gate structures traversing the nFET section, the insulator pillar and the pFET section (1808).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:

forming an insulator pillar between n-doped and p-doped field effect transistor (nFET and pFET) sections;

growing sacrificial undoped source or drain (S/D) regions in the nFET and pFET sections;

masking the sacrificial undoped S/D regions in one of the nFET and pFET sections and a portion of the insulator pillar exposed above the sacrificial undoped source or drain (S/D) regions in the nFET and pFET sections, the masking comprising extending a mask from a first side of the insulator pillar to beyond an opposite side and etching the mask back to parallel with the opposite side such that the portion of the insulator pillar comprises:

an entirety of an uppermost surface thereof; and a portion of a sidewall thereof at the opposite side, which is exposed above the sacrificial undoped S/D regions in the corresponding one of the nFET and pFET sections;

etching the sacrificial undoped S/D regions in the other of the nFET and pFET sections; and sequentially growing doped S/D regions in the other of the nFET and pFET sections and the one of the nFET and pFET sections.

2. The method according to claim 1, wherein:

the forming of the insulator pillar comprises forming the insulator pillar to have a width of about 10 nm or less, or the forming of the insulator pillar comprises forming the insulator pillar to have a width of about 8 nm.

3. The method according to claim 1, wherein the forming of the insulator pillar comprises forming the insulator pillar to comprise:

an uppermost surface taller than respective uppermost surfaces of the doped S/D regions with respect to a substrate; and sidewalls disposed in contact with respective short edges of nFET and pFET nanosheets surrounded by doped S/D regions in the nFET and pFET sections, respectively.

4. The method according to claim 1, wherein:

the masking of the sacrificial undoped S/D regions in the one of the nFET and pFET sections comprises forming a liner, and the liner prevents doped S/D regions breach during the growing of the doped S/D regions in the other of the nFET and pFET sections.

5. The method according to claim 1, wherein the masking of the sacrificial undoped S/D regions in the one of the nFET and pFET sections comprises forming a divot fill during epitaxy patterning to avoid overlay error.

6. The method according to claim 1, wherein the insulator pillar and the nFET and pFET sections are formed on a substrate pillar and shallow trench isolation (STI) elements surrounding portions of the substrate pillar.

7. The method according to claim 1, further comprising:

forming interlayer dielectric (ILD) around respective portions of the doped S/D regions in the nFET and pFET sections and the insulator pillar; and forming first and second contacts extending through the ILD to make contact with the doped S/D regions in the nFET and pFET sections.

8. The method according to claim 1, further comprising forming one or more gate structures traversing the nFET section, the insulator pillar and the pFET section.

9. The method according to claim 1, further comprising:

masking the sacrificial undoped S/D regions in the other of the nFET and pFET sections and a portion of the insulator pillar exposed above the sacrificial undoped source or drain (S/D) regions in the nFET and pFET sections, the masking comprising extending a mask from the opposite side of the insulator pillar to beyond the first side and etching the mask back to parallel with the first side such that the portion of the insulator pillar comprises:

an entirety of an uppermost surface thereof; and a portion of a sidewall thereof at the first side, which is exposed above the sacrificial undoped S/D regions in the corresponding one of the nFET and pFET sections; and etching the sacrificial undoped S/D regions in the one of the nFET and pFET sections.

10. A method of fabricating a semiconductor device, the method comprising:

forming an insulator pillar between n-doped and p-doped field effect transistor (nFET and pFET) sections;

growing sacrificial undoped source or drain (S/D) regions in the nFET and pFET sections;

masking the sacrificial undoped S/D regions in one of the nFET and pFET sections, the masking comprising:

lining a sidewall of the insulator pillar which is exposed above the sacrificial undoped S/D regions at a first side of the insulator pillar;

extending a mask from the first side of the insulator pillar to beyond an opposite side;

etching the mask back from the opposite side to beyond the liner at the first side; and filling a space between a remainder of the mask and the liner at the first side;

etching the sacrificial undoped S/D regions in the other of the nFET and pFET sections; and sequentially growing doped S/D regions in the other of the nFET and pFET sections and the one of the nFET and pFET sections.

11. The method according to claim 10, further comprising:

masking the sacrificial undoped S/D regions in the other of the nFET and pFET sections, the masking comprising:

lining a sidewall of the insulator pillar which is exposed above the sacrificial undoped S/D regions at the opposite side of the insulator pillar;

extending a mask from the opposite side of the insulator pillar to beyond the first side;

etching the mask back from the first side to beyond the liner at the opposite side; and filling a space between a remainder of the mask and the liner at the opposite side;

etching the sacrificial undoped S/D regions in the one of the nFET and pFET sections.

12. A method of fabricating a semiconductor device, the method comprising:

forming an insulator pillar between n-doped and p-doped field effect transistor (nFET and pFET) sections, the nFET section comprising nanosheets and the pFET section comprising nanosheets;

growing sacrificial undoped source or drain (S/D) regions in the nFET and pFET sections;

masking the sacrificial undoped S/D regions in one of the nFET and pFET sections;

etching the sacrificial undoped S/D regions in the other of the nFET and pFET sections;

repeating the masking and the etching in the other of the nFET and pFET sections and in the one of the nFET and pFET sections, respectively; and sequentially growing doped S/D regions in the other of the nFET and pFET sections to surround the corresponding nanosheets therein and the one of the nFET and pFET sections to surround the corresponding nanosheets therein, wherein the masking comprises masking the sacrificial undoped S/D regions in the one or the other of the nFET and pFET sections, and the masking comprises lining a sidewall of the insulator pillar which is exposed above the sacrificial undoped S/D regions, extending a mask across the insulator pillar, etching the mask back across the insulator pillar and filling a space between a remainder of the mask and the liner.

13. The method according to claim 12, wherein the nanosheets comprise remainders of silicon germanium layers in the nFET and pFET sections.

* * * * *